US010128810B2

(12) United States Patent
Kuo

(10) Patent No.: US 10,128,810 B2
(45) Date of Patent: Nov. 13, 2018

(54) IMPEDANCE MATCHING STRUCTURE OF TRANSMISSION LINE

(71) Applicant: Alpha Networks Inc., Hsinchu (TW)

(72) Inventor: Rong-Fa Kuo, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 0 days.

(21) Appl. No.: 15/336,991

(22) Filed: Oct. 28, 2016

(65) Prior Publication Data

US 2017/0324391 A1    Nov. 9, 2017

(30) Foreign Application Priority Data

May 6, 2016 (TW) .............................. 105114171 A

(51) Int. Cl.
| | |
|---|---|
| *H03H 7/38* | (2006.01) |
| *H01P 5/02* | (2006.01) |
| *H05K 1/02* | (2006.01) |
| *H05K 3/42* | (2006.01) |

(52) U.S. Cl.
CPC ................ *H03H 7/38* (2013.01); *H01P 5/02* (2013.01); *H05K 1/0251* (2013.01); *H05K 1/0222* (2013.01); *H05K 3/429* (2013.01); *H05K 2201/0979* (2013.01)

(58) Field of Classification Search
CPC ....................................................... H03H 7/38
USPC .......................................................... 333/33
See application file for complete search history.

(56) References Cited

U.S. PATENT DOCUMENTS

| | | | |
|---|---|---|---|
| 6,521,843 B1* | 2/2003 | Kohya | H05K 1/0216 |
| | | | 174/255 |
| 6,538,538 B2 | 3/2003 | Hreish et al. | |
| 7,157,987 B2 | 1/2007 | Brunker et al. | |
| 7,535,321 B1 | 5/2009 | Degerstrom et al. | |
| 7,633,766 B2 | 12/2009 | Regnier et al. | |

(Continued)

FOREIGN PATENT DOCUMENTS

| | | |
|---|---|---|
| CN | 102333413 | 1/2012 |
| JP | 2004146810 | 5/2004 |

(Continued)

OTHER PUBLICATIONS

Taiwan Intellectual Property Office, "Notice of allowance" dated Nov. 29, 2017, Taiwan.

*Primary Examiner* — Stephen E Jones
(74) *Attorney, Agent, or Firm* — WPAT, PC

(57) ABSTRACT

An impedance matching structure is disposed on a circuit board for matching an impedance of a transmission line for transmitting an electronic signal. The structure includes: at least two redundant conducting sections coupled to different points between an input terminal and an output terminal of the transmission line, wherein the redundant conducting sections are apart from one another, and a first terminal of each of the redundant conducting sections is coupled to the transmission line, while a second terminal of each of the redundant conducting sections is apart from the transmission line; and at least one grounded conducting section, each of which corresponds to one of the redundant conducting sections, and surrounds in separation from the corresponding redundant conducting section, wherein each of the at least two redundant conducting sections is disposed in a corresponding plating hole.

10 Claims, 5 Drawing Sheets

(56) References Cited

U.S. PATENT DOCUMENTS

| | | | |
|---|---|---|---|
| 8,143,966 B2 | 3/2012 | Merritt | |
| 8,334,734 B2 | 12/2012 | Achour | |
| 8,441,327 B2 | 5/2013 | Zhou et al. | |
| 8,742,993 B2 | 6/2014 | Lee et al. | |
| 2005/0161255 A1* | 7/2005 | Takada | H05K 1/115 |
| | | | 174/262 |
| 2008/0084679 A1 | 4/2008 | Baker et al. | |

FOREIGN PATENT DOCUMENTS

| | | |
|---|---|---|
| JP | 2008091707 | 4/2008 |
| JP | 2008218497 | 9/2008 |

\* cited by examiner

IMPEDANCE MATCHING STRUCTURE OF TRANSMISSION LINE

FIELD OF THE INVENTION

The present invention relates to impedance matching, and more particularly to an impedance matching structure of a transmission line.

BACKGROUND OF THE INVENTION

In order to maintain signal transmission quality of a transmission line at a higher and higher data transmission rate, throughout characteristic impedance matching should be taken into consideration in a circuit design phase. Throughout characteristic impedance matching is even more critical for high-frequency circuitry. For assuring of satisfactory high-frequency signal transmission accuracy, characteristic impedance throughout the transmission path needs to be made consistent.

For improving the characteristic impedance matching effect, a variety of factors including width of traces, clearance between traces, plating hole structures of a multilayer printed circuit board, e.g. non-through holes or through holes, and conductor structures in the holes need to be precisely considered and well designed. For example, the characteristics of each plating hole, including pad size, pad shape, hole depth, and hole type, e.g. through hole, via, blind hole or buried hole, location of stub portion without signal transmission, and conductive structure inside the multilayer board, would have effects on signal transmission quality more or less.

In conventional designs, blind holes, buried holes or back-drilled holes are adopted to ameliorate signal reflection from the non-transmission stub portion. Please refer to FIG. 1A. For making traces of a circuit board from the first layer L1 to the fourth layer L4 by way of through holes, it is generally necessary to remove the stub portions ST of the circuit board disposed between the fourth layer L4 and the eighth layer L8. It is understood that the removal of the stub portions ST by back drilling requires precise control. Over drilling, as exemplified in FIG. 1B, would result in poor connection between traces, and insufficient drilling, as exemplified in FIG. 1C, would cause local stub residual. Both the situations would adversely effect on the resulting high-frequency characteristic impedance, and furthermore, the yield rate of products as well as costs.

SUMMARY OF THE INVENTION

Therefore, the present invention provides an impedance matching structure of a transmission line for producing a good characteristic impedance matching circuit.

The present invention further provides an impedance matching structure, which is disposed on a circuit board for matching an impedance of a transmission line for transmitting an electronic signal. The structure includes: at least two redundant conducting sections and at least one grounded conducting section, wherein each of the at least two redundant conducting sections is disposed in a corresponding plating hole. The two redundant conducting sections are coupled to different points of the transmission line between an input terminal and an output terminal of the transmission line. A first terminal of each of the redundant conducting sections is coupled to the transmission line, while a second terminal of each of the redundant conducting sections is apart from the transmission line. Furthermore, the redundant conducting sections are apart from one another, and each of the at least one grounded conducting section corresponds to one of the redundant conducting sections and surrounds in separation from the corresponding redundant conducting section.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
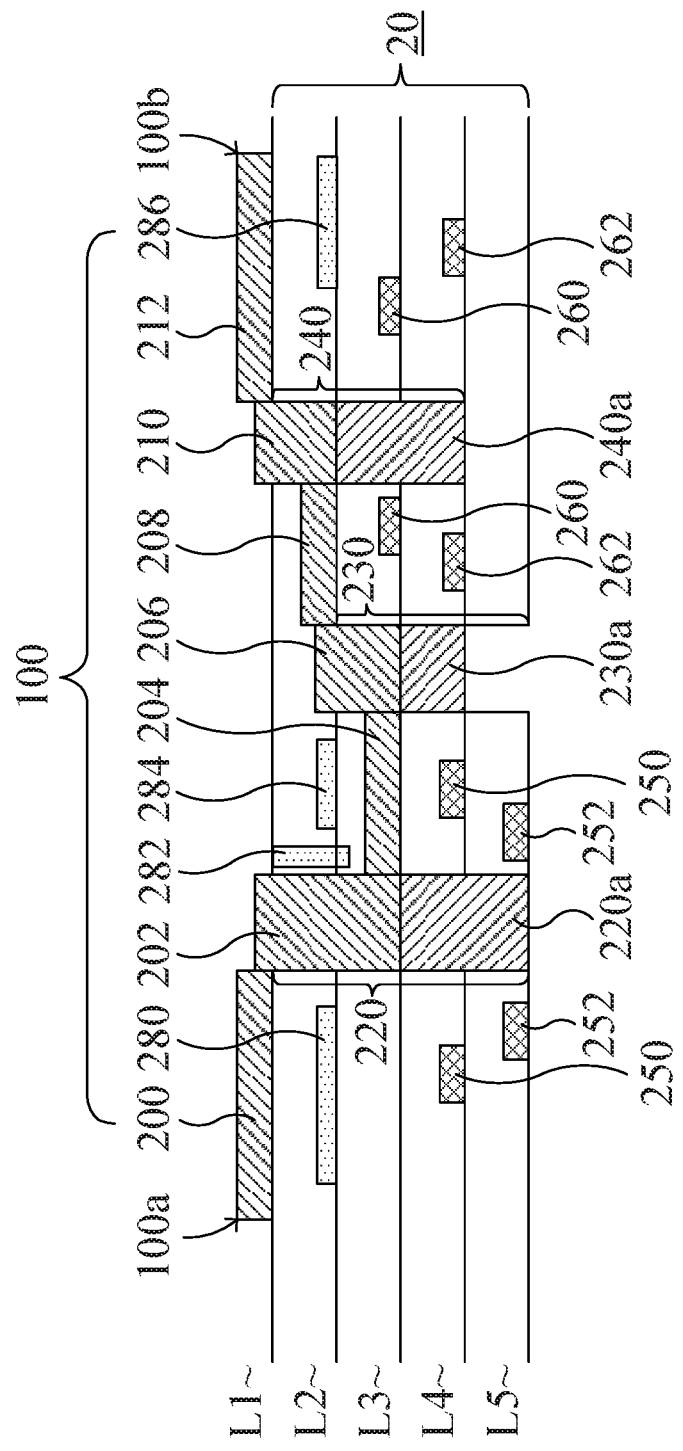
FIG. 2 is a cross-sectional view schematically illustrating an impedance matching structure of a transmission line according to an embodiment of the present invention.

Please refer to FIG. 2. An impedance matching structure of a transmission line according to an embodiment of the present invention is schematically shown. In this embodiment, the transmission line 100 is formed with conductive members 200, 202, 204, 206, 208, 210 and 212, and respective ground lines corresponding to the conductive members. In other words, the transmission line 100 can be divided into a plurality of sections, each including one of the conductive members and its corresponding ground line. It is to be noted that all the ground lines are not shown in the drawing due to the viewing angle. For example, only the ground lines 280, 282, 284 and 286 are shown. In addition to the conductive members and corresponding ground lines, the transmission line 100 has an input terminal 100a and an output terminal 100b. Signals enter the transmission line 100 via the input terminal 100a and exit the transmission line 100 via the output terminal 100b. The impedance matching structure of the transmission line 100 include redundant conducting sections 220a, 230a and 240a, and grounded conducting sections 250, 252, 260 and 262.

In the embodiment shown in FIG. 2, the transmission line 100 and its impedance matching structure are disposed in a multilayer printed circuit board 20. The multilayer printed circuit board 20 includes six layers of trace structure, first to sixth layers L1-L6, and a plurality of plating holes are provided therein. For example, through holes 220 and conductive structures formed therein, and non-through holes 230 (buried hoe) and 240 (blind hole) and conductive structures formed therein, are provided within the six layers of structure. The transmission line 100 shuttles among the layers of the multilayer printed circuit board 20 through the plating holes. For example, the transmission line 100 starts at the first layer L1 by allocating the input terminal 100a on a surface of the first layer L1, and electrically coupling the input terminal 100a to the conductive member 202 via the conductive member 200 that is also allocated on the first layer L1. The conductive member 202 is provided in the through hole 220 and further coupled to the conductive member 204, thereby transmitting signals from the conductive member 200 toward the conductive member 204. The conductive member 204 is allocated on a surface of the third layer L3, and two ends thereof are respectively electrically coupled to the conductive member 202 and the conductive member 206, thereby transmitting signals from the conductive member 202 toward the conductive member 206. The conductive member 206 is provided in the via 230 and further coupled to the conductive member 208, thereby transmitting signals from the conductive member 204 toward the conductive member 208. The conductive member 208 is allocated on a surface of the second layer L2, and two ends thereof are respectively electrically coupled to the conductive member 206 and the conductive member 210, thereby transmitting signals from the conductive member 206 toward the conductive member 210. The conductive member 210 is provided in the via 240 and further coupled to the conductive member 212, thereby transmitting signals from the conductive member 208 toward the conductive member 212. The conductive member 212 is allocated on a surface of the first layer L1, and two ends thereof are respectively electrically coupled to the conductive member 210 and the output terminal 100b, thereby transmitting signals from the conductive member 210 toward the output terminal 100b. It is understood by those skilled in the art that the signal transmission direction described above is just an example, and may be changed with complying design modification under the structure of the present invention.

In this embodiment, the conductive member 202 is disposed in a first region of the through hole 220, wherein the first region is the region from a surface of the first layer L1 or its vicinity through a surface of the third layer L3 or its vicinity. Meanwhile, a redundant conducting section 220a is disposed in a second region of the through hole 220, wherein the second region is the region from a surface of the third layer L3 or its vicinity through a surface of the fifth layer L5 or its vicinity. Likewise, the conductive member 206 is disposed in a first region of the via 230, i.e. the region from a surface of the second layer L2 or its vicinity through a surface of the third layer L3 or its vicinity. Meanwhile, a redundant conducting section 230a is disposed in a second region of the through hole 230, i.e. the region from a surface of the third layer L3 or its vicinity through a surface of the fourth layer L4 or its vicinity. Furthermore, a third region of the through hole 230 under the redundant conducting section 230a, e.g. from a surface of the fourth layer L4 or its vicinity through a surface of the fourth layer L5 or its vicinity, remains unfilled. Furthermore, the conductive member 210 is disposed in a first region of the via 240, i.e. the region from a surface of the first layer L1 or its vicinity through a surface of the second layer L2 or its vicinity. Meanwhile, a redundant conducting section 240a is disposed in a second region of the through hole 230, i.e. the region from a surface of the second layer L2 or its vicinity through a surface of the fourth layer L4 or its vicinity.

In an embodiment, respective first ends of the redundant conducting sections 220a, 230a and 240a are defined at contact area with their corresponding conductive members 202, 206 and 210. Meanwhile, respective second ends of the redundant conducting section 220a, 230a and 240a are defined at areas away from their corresponding conductive members 202, 206 and 210. Then, the respective first ends of redundant conducting sections 220a, 230a and 240a are coupled to somewhere different between the input terminal 100a and the output terminal 100b of the transmission line 100, while the respective second ends of redundant conducting sections 220a, 230a and 240a are not coupled to the transmission line 100. Furthermore, the redundant conducting sections 220a, 230a and 240a are apart from one another and there is no coupling among them.

In the above embodiment, the redundant conducting section 220a and the conductive member 202 are disposed in the same hole 220, the redundant conducting section 230a and the conductive member 206 are disposed in the same hole 230, and the redundant conducting section 240a and the conductive member 210 are disposed in the same hole 240. Nevertheless, the disposition of a redundant conducting section and an inside conductive member in a common plating hole, either through hole or non-through hole, is not essential to the present invention. When proper, redundant conducting section according to the present invention may alternatively be disposed in an exclusive plating hole. Furthermore, in consideration of characteristic impedance design, it is preferred that the material of the redundant conducting section and the material of the conductive member disposed in the same plating hole are the same, but it is not necessary. For example, a strip line may be used.

Furthermore, a grounded conducting section 250 is allocated at a surface of the fourth layer L4 around the redundant conducting section 220a; a grounded conducting section 252 is allocated at a surface of the fifth layer L5 around the redundant conducting section 220a; a grounded conducting section 260 is allocated at a surface of the third layer L3 around the redundant conducting section 240a; and a grounded conducting section 262 is allocated at a surface of the fourth layer L4 around the redundant conducting section 240a. The grounded conducting sections and the redundant conducting sections are apart from one another. By specially configuring the grounded conducting sections, for example, with specially designed dimensions, shapes, etc., a capacitance value of a capacitor structure formed between a redundant conducting section and a corresponding grounded conducting section can be adjusted so as to achieve the object of impedance matching.

Figure 3A:
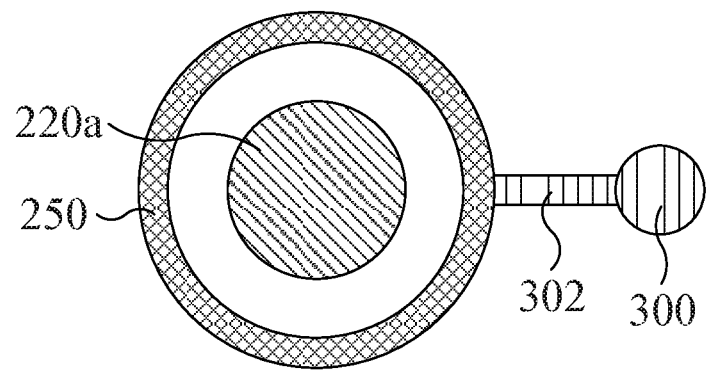
FIGS. 3A-3C are schematic diagrams illustrating three examples of a relative position of a redundant conducting section to a grounded conducting section according to an embodiment of the present invention.
Figure 3B:
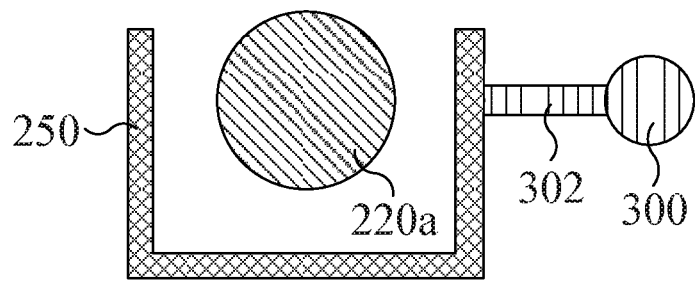
Figure 3C:
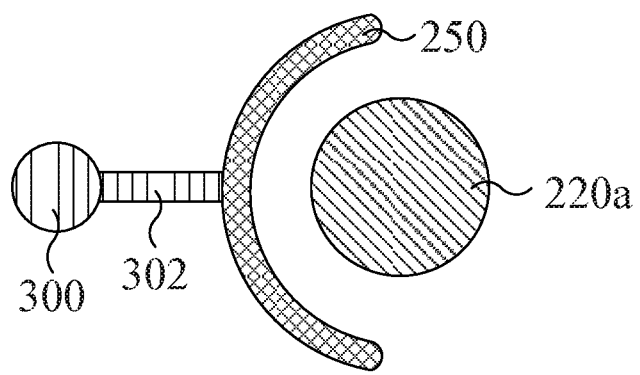

Please refer to FIGS. 3A, 3B and 3C, which schematically illustrate three examples of a relative position of a redundant conducting section to a grounded conducting section according to an embodiment of the present invention. In these examples, the relative position of the redundant conducting section 220a and the grounded conducting section 250 are referred to for illustration, and the relative positions of other pairs of redundant conducting sections and grounded conducting sections may have similar or different spatial relationships. The shapes of the other redundant conducting sections and the other grounded conducting sections may also differ from the redundant conducting section 220a and the grounded conducting section 250. Furthermore, even if there is no grounded conducting section disposed around the redundant conducting section 230a, as shown in FIG. 2, it does not mean the existence of redundant conducting section without grounded conducting section therearound is essential. In other words, whether a grounded conducting section allocated around a redundant conducting section is necessary or not depends on practical requirements. It is to be noted that the configuration of FIG. 2 is just an example rather than a limitation.

In the above examples, the grounded conducting sections are connected to ground via traces. As illustrated in FIGS. 3A, 3B and 3C, the grounded conducting section 250 is electrically coupled to a grounding line 300 via a trace 302. Alternatively, the grounded conducting section may be directly coupled to a grounding line. The grounding line 300 is further electrically coupled to a ground layer of the multilayer printed circuit board 20 so as to be capable of providing a grounding function.

Figure 4:
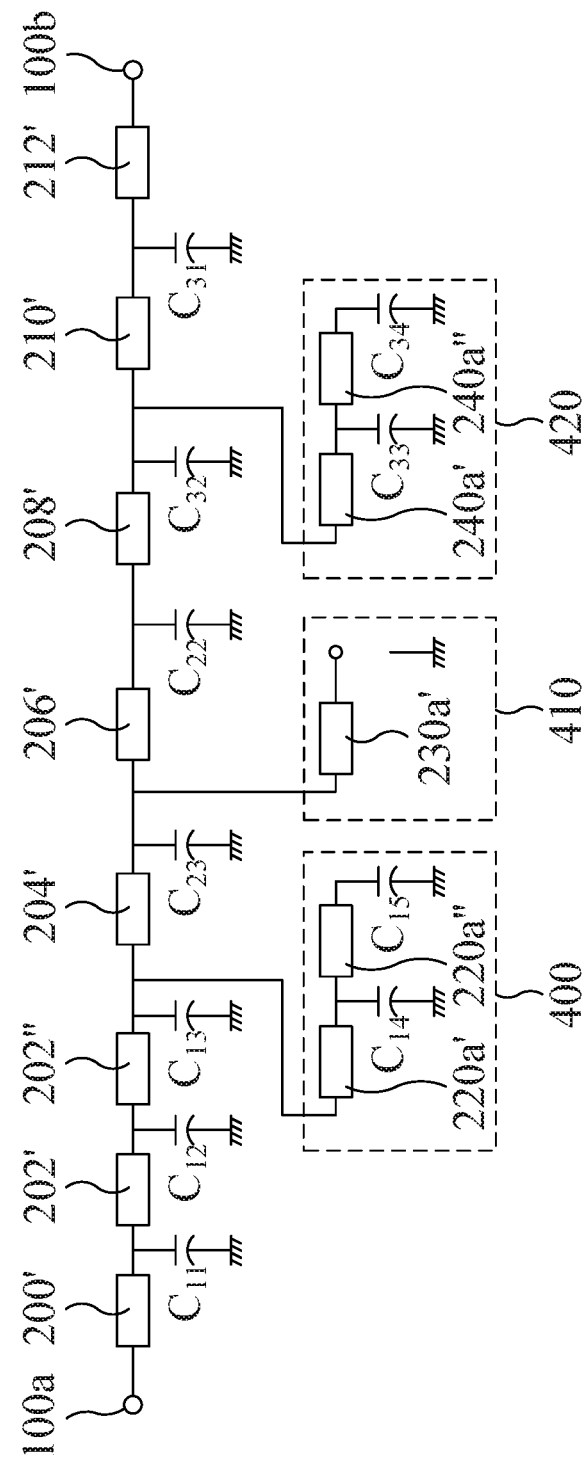
FIG. 4 is a schematic equivalent circuit block diagram of a transmission line and its impedance matching structure according to an embodiment of the present invention.

In the embodiment illustrated in FIG. 2, the second ends of the redundant conducting sections 220a, 230a and 240a are all floating, i.e. open-circuit. Therefore, the transmission line and its impedance matching structure as shown in FIG. 2 can be expressed as an equivalent circuit as shown in FIG. 4. In the equivalent circuit of FIG. 4, the circuit module 200' is equivalent to the conductive member 200; the circuit module 202' is equivalent to a portion of the conductive member 202 between the first layer L1 and the second layer L2; the circuit module 202" is equivalent to a portion of the conductive member 202 between the second layer L2 and the third layer L3; the circuit module 204' is equivalent to the conductive member 204; the circuit module 206' is equivalent to the conductive member 206; the circuit module 208' is equivalent to the conductive member 208; the circuit module 210' is equivalent to the conductive member 210; the circuit module 212' is equivalent to the conductive member 212; the circuit module 400 is equivalent to the redundant conducting section 220a and its corresponding grounded conducting sections 250 and 252; the circuit module 410 is equivalent to the redundant conducting section 230a and its corresponding grounded conducting sections 250 and 262; and the circuit module 420 is equivalent to the redundant conducting section 240a and its corresponding grounded conducting sections 260 and 262.

In this embodiment, referring to FIG. 2 and FIG. 4 from left to right, the input terminal 100a of the transmission line 100 is electrically coupled to one terminal of the equivalent circuit module 200', another terminal of equivalent circuit module 200' is electrically coupled to the equivalent capacitor $C_{11}$ and one terminal of the equivalent circuit module 202'. Another terminal of the equivalent circuit module 202' is electrically coupled to the equivalent capacitor $C_{12}$ and one terminal of the equivalent circuit module 202". Another terminal of the equivalent circuit module 202" is electrically coupled to the equivalent capacitor $C_{13}$, the equivalent circuit module 400, and one terminal of the equivalent circuit module 204'. Another terminal of the equivalent circuit module 204" is electrically coupled to the equivalent capacitor $C_{23}$, the equivalent circuit module 410, and one terminal of the equivalent circuit module 206'. Another terminal of the equivalent circuit module 206' is electrically coupled to the equivalent capacitor $C_{22}$ and one terminal of the equivalent circuit module 208'. Another terminal of the equivalent circuit module 208' is electrically coupled to the equivalent capacitor $C_{32}$, the equivalent circuit module 420, and one terminal of the equivalent circuit module 210'. Another terminal of the equivalent circuit module 210' is electrically coupled to the equivalent capacitor $C_{31}$ and one terminal of the equivalent circuit module 212'. Another terminal of the equivalent circuit module 212' is electrically coupled to the output terminal 100b of the transmission lone 100.

Furthermore, the equivalent circuit module 400 includes an equivalent circuit module 220a', equivalent circuit module 220a", equivalent capacitor $C_{14}$ and equivalent capacitor $C_{15}$. The equivalent circuit module 220a' is a portion of the redundant conducting section 220a between the third layer L3 and the fourth layer L4. The equivalent circuit module 220a" is a portion of the redundant conducting section 220a between the fourth layer L4 and the fifth layer L5. The equivalent circuit module 410 includes an equivalent circuit module 230a', and an equivalent open circuit and its corresponding ground, i.e. a reference ground equivalent to the equivalent circuit module 410, wherein the equivalent circuit module 230a' is equivalent to the redundant conducting section 230a. The equivalent circuit module 420 includes an equivalent circuit module 240a', equivalent circuit module 240a", equivalent capacitor $C_{34}$ and equivalent capacitor $C_{34}$. The equivalent circuit module 240a' is a portion of the redundant conducting section 240a between the second layer L2 and the third layer L3. The equivalent circuit module 240a" is a portion of the redundant conducting section 240a between the third layer L3 and the fourth layer L4. One terminal of the equivalent circuit module 220a' is electrically coupled to the equivalent circuit module 202", and another end thereof is electrically coupled to the equivalent capacitor $C_{14}$ and one terminal of the equivalent circuit module 220a". Another terminal of the equivalent circuit module 220a" is electrically coupled to the equivalent capacitor $C_{15}$. One terminal of the equivalent circuit module 230a' is electrically coupled to the equivalent circuit module 204', and another terminal thereof is open-circuit. One terminal of the equivalent circuit module 240a' is electrically coupled to the equivalent circuit module 208', and another end thereof is electrically coupled to the equivalent capacitor $C_{33}$ and one terminal of the equivalent circuit module 240a". Another terminal of the equivalent circuit module 240a" is electrically coupled to the equivalent capacitor $C_{34}$.

Figure 5:
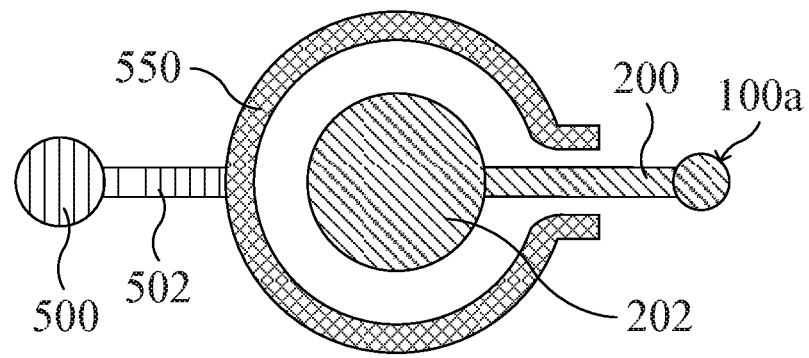
FIG. 5 is a schematic diagram illustrating a relative position of a transmission line to a ground line according to an embodiment of the present invention.

The effect of the capacitor $C_{11}$ is equivalent to the capacitance effect between the grounded conducting section 550 and the conductive member 200 as shown in FIG. 5. With the same conductive member 200, the capacitance value will vary with the dimension and the shape of the grounded conducting section 550 and the space between the conductive member 200 and the grounded conducting section 550. The grounded conducting section 550 may be grounded by electrically connecting to a grounding line 500 via a trace 502. Alternatively, the grounded conducting section 550 may be grounded by electrically connecting to the grounding line 500 directly. Therefore, in the configuration of the equivalent circuit as shown in FIG. 4, one terminal of the equivalent capacitor $C_{11}$ is electrically coupled to the equivalent circuit module 200', and another terminal thereof is grounded. The circuit design as shown in FIG. 5 prevents a signal transmitted in the conductive member 200 from being affected by adjacent traces. If the effect of adjacent traces is ignorable or unconcerned, the grounded conducting section 550 surrounding the conductive member 200 may be omitted. In other words, the equivalent capacitor $C_{11}$ may be removed from the equivalent circuitry. Similar descriptions can be applied to each of the equivalent capacitors $C_{12}$, $C_{13}$, $C_{22}$, $C_{23}$, $C_{31}$ and $C_{32}$, and will not be redundantly described herein.

Furthermore, the effect equivalent capacitor $C_{14}$ corresponds to the capacitance effect between the redundant conducting section 220a and the surrounding grounded conducting section 250 as shown in any one of FIGS. 3A, 3B and 3C. With the same redundant conducting section 220a, the capacitance value will vary with the dimension and the shape of the grounded conducting section 250 and the space between the redundant conducting section 220a and the grounded conducting section 250. Similar descriptions can be applied to each of the equivalent capacitors $C_{15}$, $C_{33}$ and $C_{34}$, and will not be redundantly described herein.

By adjusting the impedance values of the above-described equivalent circuit modules 220a' and 220a'', e.g. adjusting the length of the redundant conducting section 220a, the overall impedance of the transmission line 100 can be varied, thereby making the impedance lie within a practically required range or be a practically required value. Likewise, the overall impedance may alternatively be adjusted by adjusting the length of the redundant conducting sections 230a and/or 240a. In addition, the change of dimensions and/or shapes of one or a plurality of the grounded conducting sections, and/or the change of space between one or a plurality of the grounded conducting sections and its or their corresponding conductive member(s) or redundant conducting section(s) may also have effects on the overall impedance of the transmission line 100. Furthermore, the overall impedance of the transmission line 100 may be adjusted with the impedance value of the equivalent circuit module 204' and 208'. It is understood that the characteristic impedance values of different sections of the transmission line 100 might be different from one another, and the overall impedance of the transmission line 100 may be adjusted to a default impedance value with the characteristic impedance values of the sections. In this way, the impedance associated with a combination of the portion of the transmission line between the input terminal 100a and the output terminal 100b and the redundant conducting sections 220a-240a can be matched to the impedance of the circuit portion before the input terminal 100a; and meanwhile, the impedance associated with a combination of the portion of the transmission line between the input terminal 100a and the output terminal 100b and the redundant conducting sections 220a-240a can be matched to the impedance of the circuit portion after the output terminal 100b.

Figure 6:
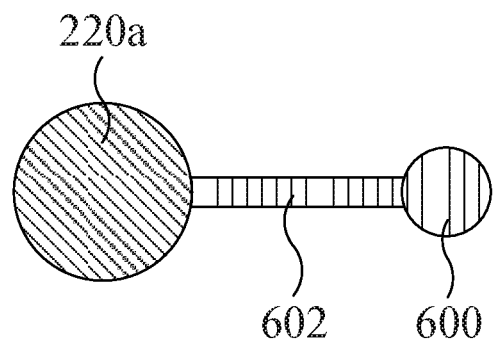
FIG. 6 is a schematic diagram illustrating an equivalent circuit rendered when a redundant conducting section is grounded.

It is to be noted that in a case that a redundant conducting section is open-circuit at an end away from the transmission line, an equivalent capacitor would be configured in an equivalent circuitry. On the other hand, in a case that a redundant conducting section is short-circuit at an end away from the transmission line, e.g. the redundant conducting section 220a as shown in FIG. 6 is electrically coupled to the grounding line 600 via a trace 602 or directly coupled to the grounding line 600 with a circle zone of the trace 602, an equivalent inductor would be configured in an equivalent circuitry. Furthermore, if it is necessary to shorten the length of the redundant conducting section 230a in a plating hole, like the via 230 as shown in FIG. 2, a back drilling technique or any other suitable technique known to those skilled in the art may be adopted. The known art would not be redundantly described herein.

The impedance matching structure of a transmission line according to the present invention is not limited to the above-described embodiments, and may be implemented with alternative means. For example, the matching with the impedance of the transmission line constructed by the conductive members 202, 204 and 206 and their corresponding ground lines can be accomplished with the redundant conducting sections 220a and 230a. The matching with the impedance of the transmission line constructed by the conductive member 204 and its corresponding ground line can also be accomplished with the redundant conducting sections 220a and 230a.

Furthermore, in this embodiment, one part of the transmission line 100 is formed on the first layer L1. The transmission line 100 on the first layer L1 is, for example, constructed by the conductive member 200 and its corresponding ground line, or constructed by the conductive member 212 and its corresponding ground line. The impedance matching of this part of transmission line can be accomplished by providing a redundant conducting section on the same first layer L1. On the other hand, the other part of the transmission line is constructed by the conductive members 202, 204, 206, 208 and 210 and their corresponding ground lines. This impedance matching is accomplished with the redundant conducting sections 220a, 230a and 240a.

Figure 1:
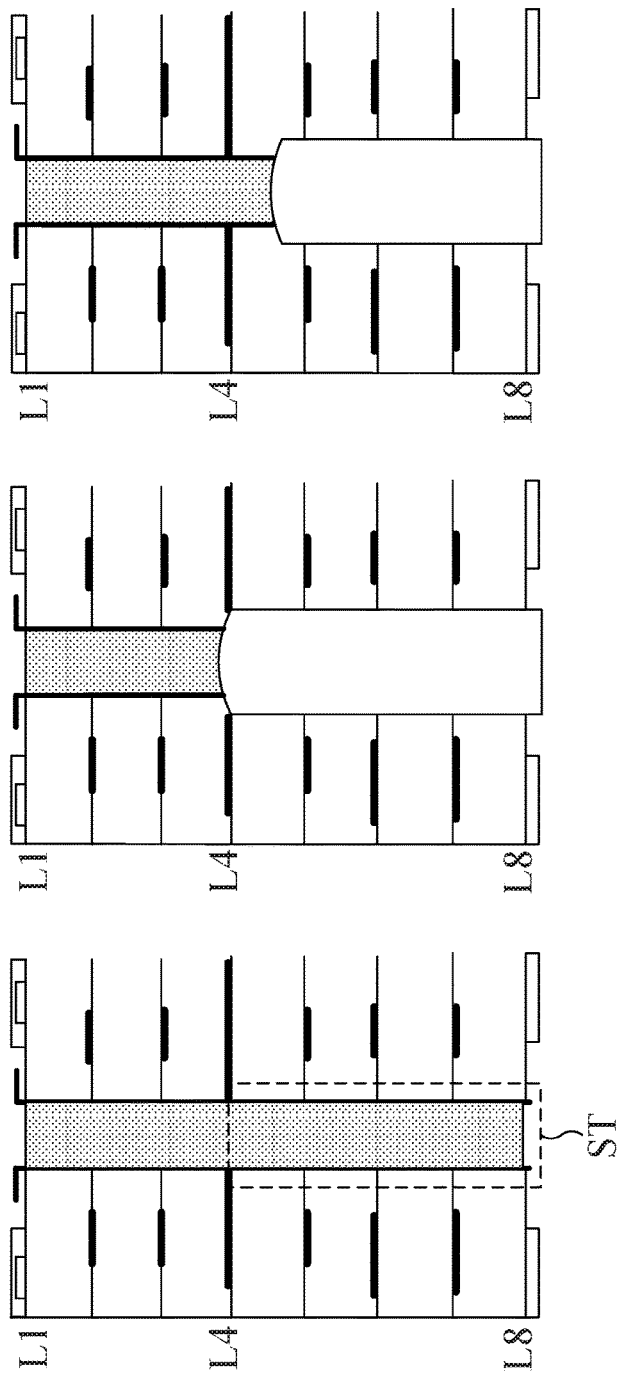
FIG. 1A is a schematic diagram illustrating a conventional trace design implemented with a through hole.
FIG. 1B is a schematic diagram illustrating a defect of a conventional trace design implemented with back drilling.
FIG. 1C is a schematic diagram illustrating another defect of a conventional trace design implemented with back drilling.

While the prior art independently deals with the impedance matching of different conductive members, e.g. conductive members 202, 204 and 206, the present invention deals with the overall impedance matching of the entire transmission line, e.g. the transmission line 100, with redundant conducting sections. Therefore, it is not necessary to remove all the redundant conducting sections. Even if the redundant conducting sections are required to be removed, for example by way of back drilling, the undesired effect of poor connection in FIG. 1 between via and traces due to over drilling can be avoided. Furthermore, since over drilling is not an issue any more, the tolerance remained for back drilling which is dealt with as the art of matching can be made small. Under this circumstance, insufficient drilling would not be an issue, either. To sum up, a circuit with a good impedance matching property can be easily produced according to the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures. For example, in spite hardware devices are exemplified as above in order to practice the redundancy power supply system and the power control circuit according to the present invention, hardware/software hybrid modules or firmware designs may also adopted as alternatives of the devices when appropriate.

What is claimed is:

1. An impedance matching structure, disposed on a circuit board for matching an impedance of a transmission line for transmitting an electronic signal, and comprising:
   at least two redundant conducting sections coupled to different points of the transmission line between an input terminal and an output terminal of the transmission line, wherein the redundant conducting sections are apart from one another, and a first terminal of each of the redundant conducting sections is coupled to the transmission line, while a second terminal of each of the redundant conducting sections is apart from the transmission line; and
   at least one grounded conducting section, each of which corresponds to and surrounds one of the redundant conducting sections, and is in separation from the corresponding redundant conducting section to form a capacitor structure for impedance matching, wherein each of the at least two redundant conducting sections is disposed in a corresponding plating hole.

2. The structure according to claim 1, wherein a length of each of the at least two redundant conducting sections is smaller than a depth of the corresponding plating hole.

3. The structure according to claim 1, wherein the second terminal of each of the redundant conducting sections is open-circuit.

4. The structure according to claim 1, wherein the second terminal of each of the redundant conducting sections is grounded.

5. The structure according to claim 1, wherein an impedance associated with a combination of a portion of the transmission line between the input terminal and the output terminal and the at least two redundant conducting sections match with an impedance of a circuit portion before the input terminal.

6. The structure according to claim 1, wherein an impedance associated with a combination of a portion of the transmission line between the input terminal and the output terminal and the at least two redundant conducting sections match with an impedance of a circuit portion after the output terminal.

7. The structure according to claim 1, wherein each of the at least two redundant conducting sections is disposed in the corresponding plating hole together with a portion of the transmission line.

8. The structure according to claim 7, wherein the redundant conducting section occupies one portion of the corresponding plating hole, and the portion of the transmission line occupies the other portion of the corresponding plating hole.

9. The structure according to claim 1, further comprising a grounding line, to which the at least one grounded conducting section is electrically coupled so as to be grounded.

10. The structure according to claim 1, wherein the transmission line includes sections with different characteristic impedances.

* * * * *